US011797231B2

(12) United States Patent
Song et al.

(10) Patent No.: US 11,797,231 B2
(45) Date of Patent: Oct. 24, 2023

(54) HAZARD DETECTION IN A MULTI-MEMORY DEVICE

(71) Applicant: Micron Technology, Inc., Boise, ID (US)

(72) Inventors: Taeksang Song, San Jose, CA (US); Saira Samar Malik, Lafayette, IN (US); Chinnakrishnan Ballapuram, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/584,104

(22) Filed: Jan. 25, 2022

(65) Prior Publication Data

US 2023/0056492 A1 Feb. 23, 2023

Related U.S. Application Data

(60) Provisional application No. 63/234,042, filed on Aug. 17, 2021.

(51) Int. Cl.
*G06F 3/06* (2006.01)
(52) U.S. Cl.
CPC ............ *G06F 3/0659* (2013.01); *G06F 3/068* (2013.01); *G06F 3/0614* (2013.01)

(58) Field of Classification Search
None
See application file for complete search history.

(56) References Cited

U.S. PATENT DOCUMENTS

| 2018/0089985 A1* | 3/2018 | Seel | G08B 1/08 |
| 2021/0174860 A1* | 6/2021 | Song | G11C 11/419 |
| 2022/0063691 A1* | 3/2022 | Hartl | B61L 29/246 |

* cited by examiner

*Primary Examiner* — Charles Rones
*Assistant Examiner* — Jonah C Krieger
(74) *Attorney, Agent, or Firm* — Holland & Hart LLP

(57) ABSTRACT

Methods, systems, and devices for hazard detection in a multi-memory device are described. A device may receive a first command that indicates a first bank address, a first row address, and a first column address. Based on the first bank address, the device may select a buffer for a hazard detection procedure that detects hazardous commands. The device may compare, as part of the hazard detection procedure, the first row address and the first column address from the first command with a second row address and a second column address from a second command in the buffer. The device may determine whether the first command and the second command are hazardous commands based on comparing the first row address and the first column address from the first command with the second row address and the second column address from the second command.

25 Claims, 6 Drawing Sheets

HAZARD DETECTION IN A MULTI-MEMORY DEVICE

CROSS REFERENCE

The present Application for Patent claims the benefit of U.S. Patent Application No. 63/234,042 by Song et al., entitled "HAZARD DETECTION IN A MULTI-MEMORY DEVICE," filed Aug. 17, 2021, assigned to the assignee hereof, and expressly incorporated by reference in its entirety herein.

FIELD OF TECHNOLOGY

The following relates generally to one or more systems for memory and more specifically to hazard detection in a multi-memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state if disconnected from an external power source.

DETAILED DESCRIPTION

A device, such as an electronic device, may include a non-volatile memory (e.g., a primary memory for storing information among other operations) and a volatile memory (e.g., a secondary memory) that may operate as a cache for the non-volatile memory. Such a configuration may allow the device to benefit from advantages of the non-volatile memory (e.g., non-volatility and persistent storage, high storage capacity, low power consumption) while maintaining compatibility with another device, such as a host device, through the volatile memory, among other aspects. To support this type of configuration, a device may include an interface controller that interfaces with the host device on behalf of the volatile memory and the non-volatile memory. The interface controller may include a queue that stores commands for one or both of the volatile memory and the non-volatile memory. If a command is received from host device, the interface controller may compare the command with all other commands in the queue as part of a hazard detection procedure to determine whether the command is a hazardous command that is subject to an ordering condition for execution. But comparing a command with all the commands in the queue may use many components, such as comparators (e.g., one per queue entry), which may increase power consumption and the net die area of the interface controller, among other disadvantages.

According to the techniques described herein, the quantity of comparators used for hazard detection may be reduced, relative to other techniques, by using components such as buffers (e.g., collapsing buffers) to determine whether commands are hazardous. For example, the interface controller may include a component, such as a collapsing buffer, for each bank of the volatile memory, and each component, such as a collapsing buffer, may store commands for the bank corresponding to that component. If a command for a bank is received from a host device, the interface controller may compare the command to the commands in the component, such as a collapsing buffer, associated with that bank. Thus, the interface controller may use a comparator for each collapsing buffer (or for each entry of the collapsing buffers) rather than using a comparator for each entry of the queue, which may reduce the power consumption of hazard detection, the collective footprint of the comparators, or both, among other advantages.

Features of the disclosure are initially described in the context of a system and memory subsystem as described with reference to FIGS. 1 and 2. Features of the disclosure are described in the context of an interface controller and a process flow as described with reference to FIGS. 3 and 4. These and other features of the disclosure are further illustrated by and described with reference to an apparatus diagram and flowcharts that relate to hazard detection in a multi-memory device as described with reference to FIGS. 5 and 6.

Figure 1:
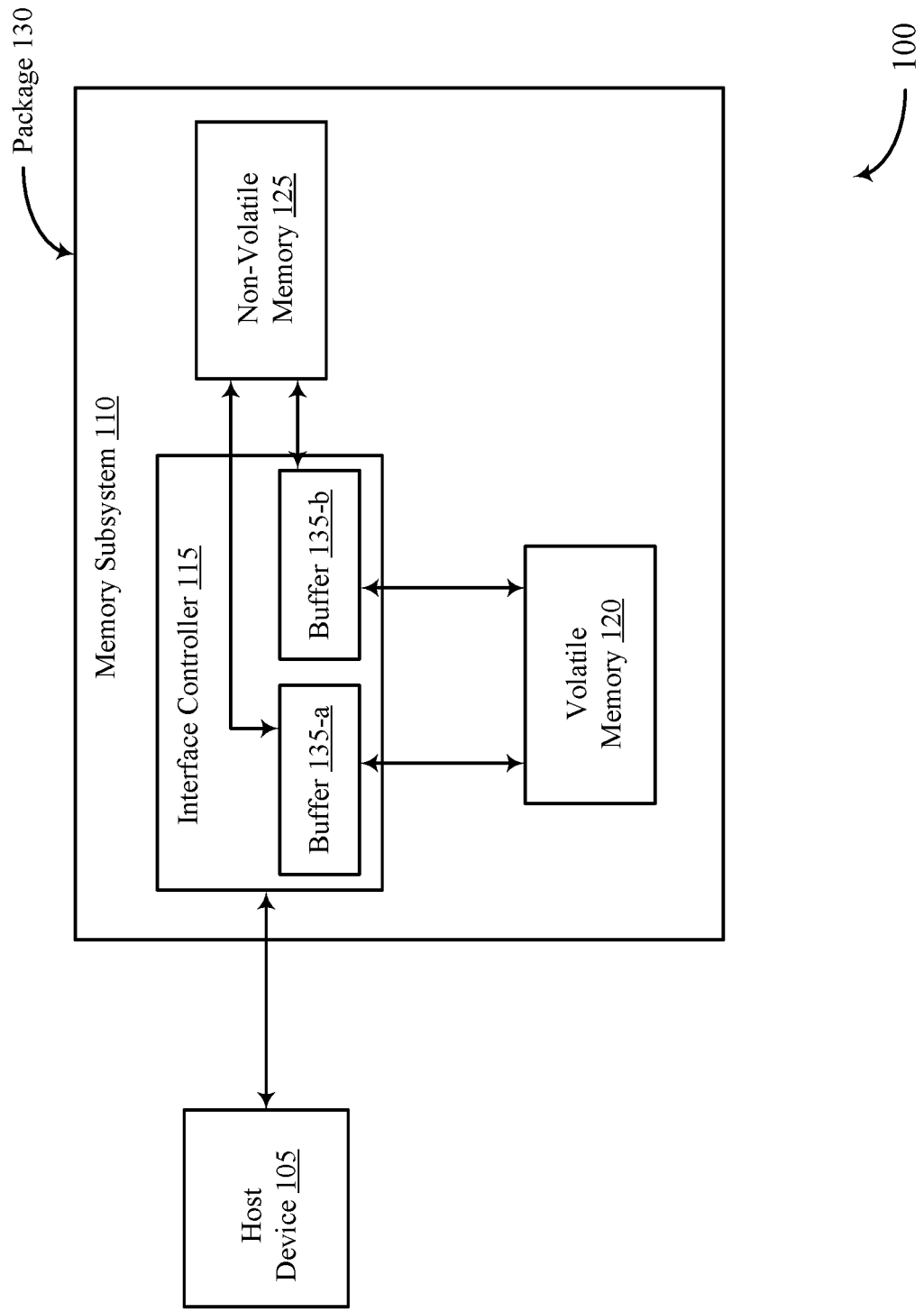
FIG. 1 illustrates an example of a system that supports hazard detection in a multi-memory device in accordance with examples as disclosed herein.

FIG. 1 illustrates an example of a system 100 that supports hazard detection in a multi-memory device in accordance with examples as disclosed herein.

The system 100 may be included in an electronic device such a computer or phone. The system 100 may include a host device 105 and a memory subsystem 110. The host device 105 may be a processor or system-on-a-chip (SoC) that interfaces with the interface controller 115 as well as other components of the electronic device that includes the system 100. The memory subsystem 110 may store and provide access to electronic information (e.g., digital information, data) for the host device 105. The memory subsystem 110 may include an interface controller 115, a volatile memory 120, and a non-volatile memory 125. In some examples, the interface controller 115, the volatile memory 120, and the non-volatile memory 125 may be included in a same physical package such as a package 130. However, the interface controller 115, the volatile memory 120, and the non-volatile memory 125 may be disposed on different, respective dies (e.g., silicon dies).

The devices in the system 100 may be coupled by various conductive lines (e.g., traces, printed circuit board (PCB) routing, redistribution layer (RDL) routing) that may enable the communication of information (e.g., commands, addresses, data) between the devices. The conductive lines may make up channels, data buses, command buses, address buses, and the like.

The memory subsystem 110 may be configured to provide the benefits of the non-volatile memory 125 while maintaining compatibility with a host device 105 that supports protocols for a different type of memory, such as the volatile memory 120, among other examples. For example, the non-volatile memory 125 may provide benefits (e.g., relative to the volatile memory 120) such as non-volatility, higher capacity, or lower power consumption. But the host device 105 may be incompatible or inefficiently configured with various aspects of the non-volatile memory 125. For instance, the host device 105 may support voltages, access latencies, protocols, page sizes, etc. that are incompatible with the non-volatile memory 125. To compensate for the incompatibility between the host device 105 and the non-volatile memory 125, the memory subsystem 110 may be configured with the volatile memory 120, which may be compatible with the host device 105 and serve as a cache for the non-volatile memory 125. Thus, the host device 105 may use protocols supported by the volatile memory 120 while benefitting from the advantages of the non-volatile memory 125.

In some examples, the system 100 may be included in, or coupled with, a computing device, electronic device, mobile computing device, or wireless device. The device may be a portable electronic device. For example, the device may be a computer, a laptop computer, a tablet computer, a smartphone, a cellular phone, a wearable device, an internet-connected device, or the like. In some examples, the device may be configured for bi-directional wireless communication via a base station or access point. In some examples, the device associated with the system 100 may be capable of machine-type communication (MTC), machine-to-machine (M2M) communication, or device-to-device (D2D) communication. In some examples, the device associated with the system 100 may be referred to as a user equipment (UE), station (STA), mobile terminal, or the like.

The host device 105 may be configured to interface with the memory subsystem 110 using a first protocol (e.g., low-power double data rate (LPDDR)) supported by the interface controller 115. Thus, the host device 105 may, in some examples, interface with the interface controller 115 directly and the non-volatile memory 125 and the volatile memory 120 indirectly. In alternative examples, the host device 105 may interface directly with the non-volatile memory 125 and the volatile memory 120. The host device 105 may also interface with other components of the electronic device that includes the system 100. The host device 105 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host.

The interface controller 115 may be configured to interface with the volatile memory 120 and the non-volatile memory 125 on behalf of the host device 105 (e.g., based on or in response to one or more commands or requests issued by the host device 105). For instance, the interface controller 115 may facilitate the retrieval and storage of data in the volatile memory 120 and the non-volatile memory 125 on behalf of the host device 105. Thus, the interface controller 115 may facilitate data transfer between various subcomponents, such as between at least some of the host device 105, the volatile memory 120, or the non-volatile memory 125. The interface controller 115 may interface with the host device 105 and the volatile memory 120 using the first protocol and may interface with the non-volatile memory 125 using a second protocol supported by the non-volatile memory 125.

The non-volatile memory 125 may be configured to store digital information (e.g., data) for the electronic device that includes the system 100. Accordingly, the non-volatile memory 125 may include an array or arrays of memory cells and a local memory controller configured to operate the array(s) of memory cells. In some examples, the memory cells may be or include FeRAM cells (e.g., the non-volatile memory 125 may be FeRAM). The non-volatile memory 125 may be configured to interface with the interface controller 115 using the second protocol that is different than the first protocol used between the interface controller 115 and the host device 105. In some examples, the non-volatile memory 125 may have a longer latency for access operations than the volatile memory 120. For example, retrieving data from the non-volatile memory 125 may take longer than retrieving data from the volatile memory 120. Similarly, writing data to the non-volatile memory 125 may take longer than writing data to the volatile memory 120. In some examples, the non-volatile memory 125 may have a smaller page size than the volatile memory 120, as described herein.

The volatile memory 120 may be configured to operate as a cache for one or more components, such as the non-volatile memory 125. For example, the volatile memory 120 may store information (e.g., data) for the electronic device that includes the system 100. Accordingly, the volatile memory 120 may include an array or arrays of memory cells and a local memory controller configured to operate the array(s) of memory cells. In some examples, the memory cells may be or include DRAM cells (e.g., the volatile memory may be DRAM). The non-volatile memory 125 may be configured to interface with the interface controller 115 using the first protocol that is used between the interface controller 115 and the host device 105.

In some examples, the volatile memory 120 may have a shorter latency for access operations than the non-volatile memory 125. For example, retrieving data from the volatile memory 120 may take less time than retrieving data from the non-volatile memory 125. Similarly, writing data to the volatile memory 120 may take less time than writing data to the non-volatile memory 125. In some examples, the volatile memory 120 may have a larger page size than the non-volatile memory 125. For instance, the page size of volatile memory 120 may be 2 kilobytes (2 kB) and the page size of non-volatile memory 125 may be 64 bytes (64B) or 128 bytes (128B).

Although the non-volatile memory 125 may be a higher-density memory than the volatile memory 120, in some examples, accessing the non-volatile memory 125 may take longer than accessing the volatile memory 120 (e.g., due to different architectures and protocols, among other reasons). Accordingly, operating the volatile memory 120 as a cache may reduce latency in the system 100. As an example, an access request for data from the host device 105 may be satisfied relatively quickly by retrieving the data from the volatile memory 120 rather than from the non-volatile memory 125. To facilitate operation of the volatile memory 120 as a cache, the interface controller 115 may include multiple buffers 135. The buffers 135 may be disposed on the same die as the interface controller 115 and may be configured to temporarily store data for transfer between the volatile memory 120, the non-volatile memory 125, or the host device 105 (or any combination thereof) during one or more access operations (e.g., storage and retrieval operations).

An access operation may also be referred to as an access process or access procedure and may involve one or more sub-operations that are performed by one or more of the components of the memory subsystem 110. Examples of access operations may include storage operations in which data provided by the host device 105 is stored (e.g., written to) in the volatile memory 120 or the non-volatile memory 125 (or both), and retrieval operations in which data requested by the host device 105 is obtained (e.g., read) from the volatile memory 120 or the non-volatile memory 125 and is returned to the host device 105.

To store data in the memory subsystem 110, the host device 105 may transmit a write command (also referred to as a write request, a storage command, or a storage request) to the interface controller 115. The write command may include or be accompanied by a memory address that targets a location (e.g., a set of cells) in the non-volatile memory 125. In some examples, a set of memory cells may also be referred to as a portion of memory. The host device 105 may also provide the data to be written. The interface controller 115 may temporarily store the data in the buffer 135-a. After storing the data in the buffer 135-a, the interface controller 115 may transfer the data from the buffer 135-a to the volatile memory 120 or the non-volatile memory 125 or both. In write-through mode, the interface controller 115 may transfer the data to both the volatile memory 120 and the non-volatile memory 125. In write-back mode, the interface controller 115 may simply transfer the data to the volatile memory 120 (with the data being transferred to the non-volatile memory 125 during a later eviction process).

In either mode, the interface controller 115 may identify an appropriate location (e.g., set of volatile memory cells) in the volatile memory 120 for storing the data associated with the write command. To do so, the interface controller 115 may implement set-associative mapping in which addresses of the non-volatile memory 125 are mapped to multiple addresses of the volatile memory 120. For instance, the interface controller 115 may implement n-way associative mapping which allows data from (or for) an address (e.g., location, set of non-volatile memory cells) of the non-volatile memory 125 to be stored at one of n addresses (e.g., locations, sets of volatile memory cells, cache blocks) of the volatile memory 120, where the n addresses may collectively be referred to as a set. Thus, the interface controller 115 may manage the volatile memory 120 as a cache for the non-volatile memory 125 by referencing the set of n addresses the volatile memory 120 associated with a targeted address. Although described with reference to set-associative mapping, the interface controller 115 may manage the volatile memory 120 as a cache by implementing one or more other types of mapping such as direct mapping or associative mapping, among other examples.

After determining which set of n addresses is associated with the targeted non-volatile address, the interface controller 115 may store the data at one of the n addresses in the set. This way, a subsequent (e.g., following) read command from the host device 105 for the data can be efficiently satisfied by retrieving the data from the lower-latency volatile memory 120 instead of retrieving the data from the higher-latency non-volatile memory 125. Thus, a write command by the host device 105 may be wholly (e.g., in write-back mode) or partially (e.g., in write-through mode) satisfied by storing the data in the volatile memory 120. To track the data stored in the volatile memory 120, the interface controller 115 may use tag addresses that indicate which data is stored at different addresses of the volatile memory 120.

To retrieve data from the memory subsystem 110, the host device 105 transmit a read command (also referred to as a read request, a retrieval command, or a retrieval request) to the interface controller 115. The read command may target an address of the non-volatile memory 125. Upon receiving the read command, the interface controller 115 may check for the requested data in the volatile memory 120. For instance, the interface controller 115 may check whether the requested data is stored at one of the n addresses associated with the targeted non-volatile memory address. If the data is stored at one of the n addresses, the interface controller 115 may transfer the data from the volatile memory 120 to the buffer 135-a so that it can be transmitted to the host device 105. In general, the term "hit" may be used to refer to the scenario where the volatile memory 120 stores data targeted by the host device 105.

If the volatile memory 120 does not store the requested data, the interface controller 115 may transfer the requested data from the non-volatile memory 125 to the buffer 135-a so that it can be transmitted to the host device 105. In general, the term "miss" may be used to refer to the scenario where the volatile memory 120 does not store data targeted by the host device 105. In a miss scenario, after transferring the requested data to the buffer 135-a, the interface controller 115 may transfer the requested data from the buffer 135-a to the volatile memory 120 so that subsequent read requests for the data can be satisfied by the volatile memory 120 instead of the non-volatile memory 125. For example, the interface controller 115 may store the data at one of the n addresses in the set associated with the targeted non-volatile memory address. If the n addresses are already storing other data, the interface controller 115 may transfer the other data to the buffer 135-b so that it can be transferred to the non-volatile memory 125 for storage. Such a process may be referred to as "eviction" and the data transferred from the volatile memory 120 to the buffer 135-b may be referred to as "victim" data.

In some cases, the interface controller 115 may transfer a subset of the victim data from the buffer 135-b to the non-volatile memory 125. For example, the interface controller 115 may transfer one or more subsets of victim data that have changed since the data was initially stored in the non-volatile memory 125. Data that is inconsistent between the volatile memory 120 and the non-volatile memory 125 (e.g., due to an update in one memory and not the other) may be referred to in some cases as "modified" or "dirty" data. In some examples (e.g., if interface controller operates in one mode such as a write-back mode), dirty data may be data that is present in the volatile memory 120 but not present in the non-volatile memory 125.

So, the interface controller 115 may perform an eviction procedure to save data from the volatile memory 120 to the non-volatile memory 125 if the volatile memory 120 is full (e.g., to make space for new data in the volatile memory 120). In some examples, the interface controller 115 may perform a "fill" procedure in which data from the non-volatile memory 125 is saved to the volatile memory 120. The interface controller 115 may perform a fill procedure in the event of a miss (e.g., to populate the volatile memory 120 with relevant data). For example, in the event of a read miss, which occurs if a read command from the host device 105 targets data stored in the non-volatile memory 125 instead of the volatile memory 120, the interface controller 115 may retrieve (from the non-volatile memory 125) the data requested by the read command and, in addition to returning the data to the host device, store the data in the volatile memory 120 (e.g., so that the data can be retrieved quickly in the future).

Thus, the memory subsystem 110 may satisfy (or "fulfill") requests (e.g., read commands, write commands) from the host device 105 using either the volatile memory 120 or the non-volatile memory 125, depending on the hit or miss status of the request. For example, in the event of a read miss, the read command from the host device 105 may be satisfied by the non-volatile memory 125, which means that the data returned from the host device 105 may originate from the non-volatile memory 125. And in the event of a read hit, the read command from the host device 105 may be satisfied by the volatile memory 120, which means that the data returned from the host device 105 may originate from the volatile memory 120. In some examples, the ratio of hits to misses ("hit-to-miss ratio") may be relatively high (e.g., the hit percentage (or "hit rate") may be around 85% whereas the miss percentage (or "miss rate") may be around 15%).

In some examples, the interface controller 115 may include a queue that stores commands for the volatile memory 120 and the non-volatile memory 125. The interface controller 115 may add to the queue commands received from the host device 105, among other (e.g., internally generated) commands. In some examples, the interface controller 115 may perform hazard detection to detect hazardous commands, which may be commands that are subject to ordering conditions for execution. For example, consider a write command for a bank, a row, and a column that is received before a read command for that bank, row, and column. In such a scenario (referred to as a read-after-write hazard), the write command and read commands may be hazardous commands because the write command should be executed before the read command (otherwise the read command may return incorrect data). Thus, commands with the same address information (e.g., the same bank address, row address, and column address) may be hazardous commands.

According to the techniques described herein, the interface controller 115 may perform hazard detection by comparing a received command to the commands in a bank-specific buffer. For example, a command for bank x may be compared to the commands in the buffer for bank x, rather than compared to the commands in the queue. The bank-specific buffer may store fewer commands than the queue, which may allow the interface controller 115 to reduce the quantity of comparators used for the hazard detection (e.g., relative to techniques that compare the commands in the queue). Indeed, the bank-specific buffers may be limited to few entries each so that the total quantity of entries across the bank-specific buffers is less than the total quantity of entries in the queue. Thus, the interface controller 115 may reduce power consumption and increase the available die space (relative to other techniques) by reducing the quantity of comparators used for hazard detection.

The system 100 may include any quantity of non-transitory computer readable media that support hazard detection as described herein. For example, the host device 105, the interface controller 115, the volatile memory 120, or the non-volatile memory 125 may include or otherwise may access one or more non-transitory computer readable media storing instructions (e.g., firmware) for performing the functions ascribed herein to the host device 105, the interface controller 115, the volatile memory 120, or the non-volatile memory 125. For example, such instructions, if executed by the host device 105 (e.g., by a host device controller), by the interface controller 115, by the volatile memory 120 (e.g., by a local controller), or by the non-volatile memory 125 (e.g., by a local controller), may cause the host device 105, the interface controller 115, the volatile memory 120, or the non-volatile memory 125 to perform associated functions as described herein.

Figure 2:
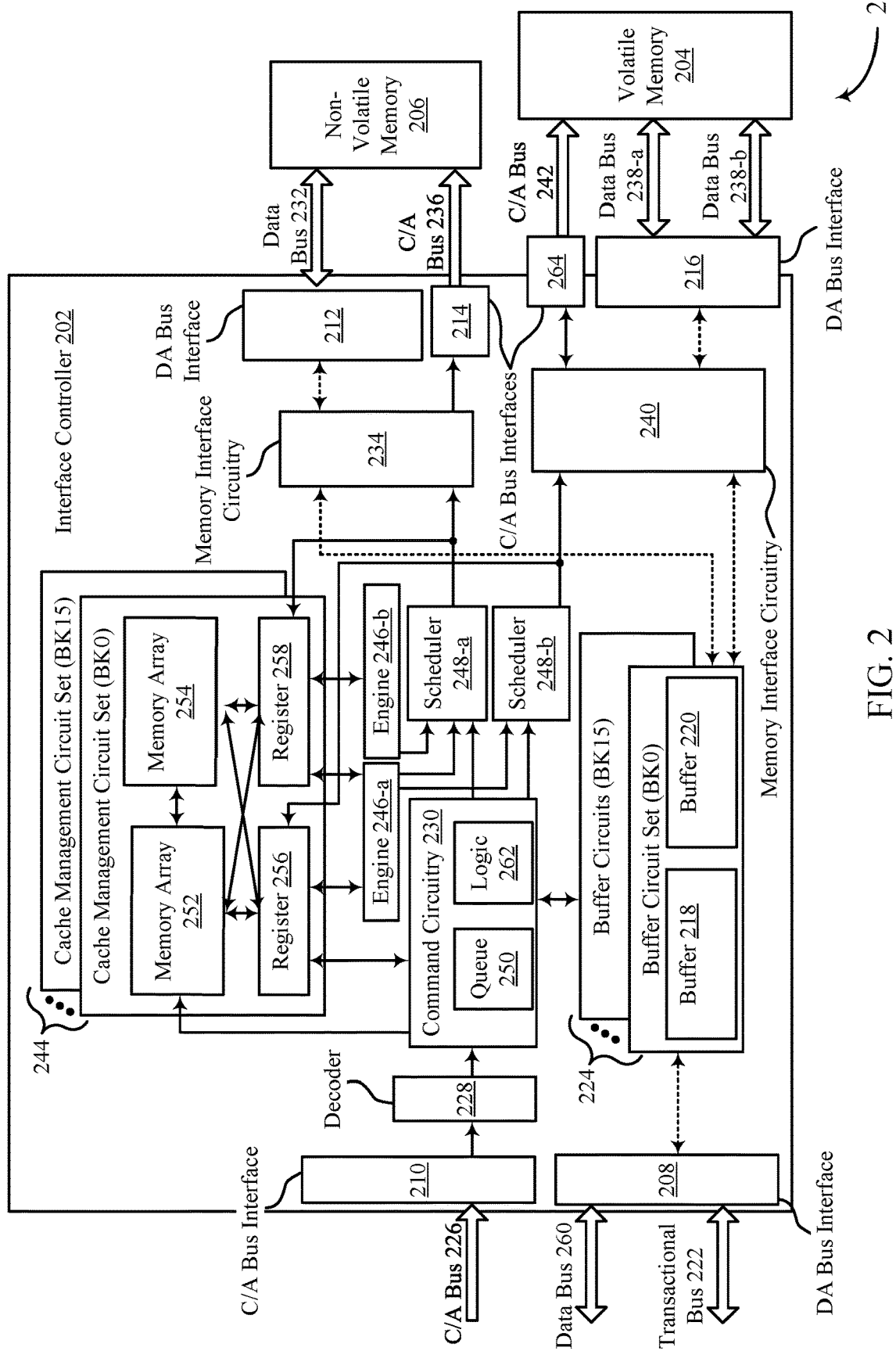
FIG. 2 illustrates an example of a memory subsystem that supports hazard detection in a multi-memory device in accordance with examples as disclosed herein.

FIG. 2 illustrates an example of a memory subsystem 200 that supports hazard detection in a multi-memory device in accordance with examples as disclosed herein. The memory subsystem 200 may be an example of the memory subsystem 110 described with reference to FIG. 1. Accordingly, the memory subsystem 200 may interact with a host device as described with reference to FIG. 1. The memory subsystem 200 may include an interface controller 202, a volatile memory 204, and a non-volatile memory 206, which may be examples of the interface controller 115, the volatile memory 120, and the non-volatile memory 125, respectively, as described with reference to FIG. 1. Thus, the interface controller 202 may interface with the volatile memory 204 and the non-volatile memory 206 on behalf of the host device as described with reference to FIG. 1. For example, the interface controller 202 may operate the volatile memory 204 as a cache for the non-volatile memory 206. Operating the volatile memory 204 as the cache may allow subsystem to provide the benefits of the non-volatile memory 206 (e.g., non-volatile, high-density storage) while maintaining compatibility with a host device that supports a different protocol than the non-volatile memory 206.

In FIG. 2, dashed lines between components represent the flow of data or communication paths for data and solid lines between components represent the flow of commands or communication paths for commands. In some cases, the memory subsystem 200 is one of multiple similar or identical subsystems that may be included in an electronic device. Each subsystem may be referred to as a slice and may be associated with a respective channel of a host device in some examples.

The non-volatile memory 206 may be configured to operate as a main memory (e.g., memory for long-term data storage) for a host device. In some cases, the non-volatile memory 206 may include one or more arrays of FeRAM cells. Each FeRAM cell may include a selection component and a ferroelectric capacitor and may be accessed by applying appropriate voltages to one or more access lines such as word lines, plates lines, and digit lines. In some examples, a subset of FeRAM cells coupled with to an activated word line may be sensed, for example concurrently or simultaneously, without having to sense all FeRAM cells coupled with the activated word line. Accordingly, a page size for an FeRAM array may be different than (e.g., smaller than) a DRAM page size. In the context of a memory device, a page may refer to the memory cells in a row (e.g., a group of the memory cells that have a common row address) and a page size may refer to the quantity of memory cells or column addresses in a row, or the quantity of column addresses accessed during an access operation. Alternatively, a page size may refer to a size of data handled by various interfaces or the amount of data a row is capable of storing. In some cases, different memory device types may have different page sizes. For example, a DRAM page size (e.g., 2 kB) may be a superset of a non-volatile memory (e.g., FeRAM) page size (e.g., 64B).

A smaller page size of an FeRAM array may provide various efficiency benefits, as an individual FeRAM cell may need more power to read or write than an individual DRAM cell. For example, a smaller page size for an FeRAM array may facilitate effective energy usage because a smaller quantity of FeRAM cells may be activated if an associated change in information is minor. In some examples, the page size for an array of FeRAM cells may vary, for example dynamically (e.g., during operation of the array of FeRAM cells) depending on the nature of data and command utilizing FeRAM operation.

Although an individual FeRAM cell may need more power to read or write than an individual DRAM cell, an FeRAM cell may maintain a stored logic state for an extended period of time in the absence of an external power source, as the ferroelectric material in the FeRAM cell may maintain a non-zero electric polarization in the absence of an electric field. Therefore, including an FeRAM array in the non-volatile memory 206 may provide power and efficiency benefits relative to volatile memory cells (e.g., DRAM cells in the volatile memory 204), as it may reduce or eliminate constraints to perform refresh operations.

The volatile memory 204 may be configured to operate as a cache for the non-volatile memory 206. In some cases, the volatile memory 204 may include one or more arrays of DRAM cells. Each DRAM cell may include a capacitor that includes a dielectric material to store a charge representative of the programmable state. The memory cells of the volatile memory 204 may be logically grouped or arranged into one or more memory banks (as referred to herein as "banks"). For example, volatile memory 204 may include sixteen banks. The memory cells of a bank may be arranged in a grid or an array of intersecting columns and rows and each memory cell may be accessed or refreshed by applying appropriate voltages to the digit line (e.g., column line) and word line (e.g., row line) for that memory cell. The rows of a bank may be referred to pages, and the page size may refer to the quantity of columns or memory cells in a row (and thus, the amount of data a row is capable of storing). As noted, the page size of the volatile memory 204 may be different than (e.g., larger than) the page size of the non-volatile memory 206.

The interface controller 202 may include various circuits for interfacing (e.g., communicating) with other devices, such as a host device, the volatile memory 204, and the non-volatile memory 206. For example, the interface controller 202 may include a data (DA) bus interface 208, a command and address (C/A) bus interface 210, a data bus interface 212, a C/A bus interface 214, a data bus interface 216, and a C/A bus interface 264. The data bus interfaces may support the communication of information using one or more communication protocols. For example, the data bus interface 208, the C/A bus interface 210, the data bus interface 216, and the C/A bus interface 264 may support information that is communicated using a first protocol (e.g., LPDDR signaling), whereas the data bus interface 212 and the C/A bus interface 214 may support information communicated using a second protocol. Thus, the various bus interfaces coupled with the interface controller 202 may support different amounts of data or data rates.

The data bus interface 208 may be coupled with the data bus 260, the transactional bus 222, and the buffer circuitry 224. The data bus interface 208 may be configured to transmit and receive data over the data bus 260 and control information (e.g., acknowledgements/negative acknowledgements) or metadata over the transactional bus 222. The data bus interface 208 may also be configured to transfer data between the data bus 260 and the buffer circuitry 224. The data bus 260 and the transactional bus 222 may be coupled with the interface controller 202 and the host device such that a conductive path is established between the interface controller 202 and the host device. In some examples, the pins of the transactional bus 222 may be referred to as data mask inversion (DMI) pins. Although shown with one data bus 260 and one transactional bus 222, there may be any quantity of data buses 260 and any quantity of transactional buses 222 coupled with one or more data bus interfaces 208.

The C/A bus interface 210 may be coupled with the C/A bus 226 and the decoder 228. The C/A bus interface 210 may be configured to transmit and receive commands and addresses over the C/A bus 226. The commands and addresses received over the C/A bus 226 may be associated with data received or transmitted over the data bus 260. The C/A bus interface 210 may also be configured to transmit commands and addresses to the decoder 228 so that the decoder 228 can decode the commands and relay the decoded commands and associated addresses to the command circuitry 230.

The data bus interface 212 may be coupled with the data bus 232 and the memory interface circuitry 234. The data bus interface 212 may be configured to transmit and receive data over the data bus 232, which may be coupled with the non-volatile memory 206. The data bus interface 212 may also be configured to transfer data between the data bus 232 and the memory interface circuitry 234. The C/A bus interface 214 may be coupled with the C/A bus 236 and the memory interface circuitry 234. The C/A bus interface 214 may be configured to receive commands and addresses from the memory interface circuitry 234 and relay the commands and the addresses to the non-volatile memory 206 (e.g., to a local controller of the non-volatile memory 206) over the C/A bus 236. The commands and the addresses transmitted over the C/A bus 236 may be associated with data received or transmitted over the data bus 232. The data bus 232 and the C/A bus 236 may be coupled with the interface controller 202 and the non-volatile memory 206 such that conductive paths are established between the interface controller 202 and the non-volatile memory 206.

The data bus interface 216 may be coupled with the data buses 238 (e.g., data bus 238-*a*, data bus 238-*b*) and the memory interface circuitry 240. The data bus interface 216 may be configured to transmit and receive data over the data buses 238, which may be coupled with the volatile memory 204. The data bus interface 216 may also be configured to transfer data between the data buses 238 and the memory interface circuitry 240. The C/A bus interface 264 may be coupled with the C/A bus 242 and the memory interface circuitry 240. The C/A bus interface 264 may be configured to receive commands and addresses from the memory interface circuitry 240 and relay the commands and the addresses to the volatile memory 204 (e.g., to a local controller of the volatile memory 204) over the C/A bus 242. The commands and addresses transmitted over the C/A bus 242 may be associated with data received or transmitted over the data buses 238. The data bus 238 and the C/A bus 242 may be coupled with the interface controller 202 and the volatile memory 204 such that conductive paths are established between the interface controller 202 and the volatile memory 204.

In addition to buses and bus interfaces for communicating with coupled devices, the interface controller 202 may include circuitry for operating the non-volatile memory 206 as a main memory and the volatile memory 204 as a cache. For example, the interface controller 202 may include command circuitry 230, buffer circuitry 224, cache management circuitry 244, one or more engines 246, and one or more schedulers 248.

The command circuitry 230 may be coupled with the buffer circuitry 224, the decoder 228, the cache management circuitry 244, and the schedulers 248, among other components. The command circuitry 230 may be also be referred to as a controller and may be configured to manage commands for the volatile memory and commands for the non-volatile memory. The command circuitry 230 may be configured to receive command and address information from the decoder 228 and store the command and address information in the queue 250. The command circuitry 230 may include logic 262 that processes command information (e.g., from a host device) and metadata from other components (e.g., the cache management circuitry 244, the buffer circuitry 224) and uses that information to generate one or more commands for the schedulers 248. The command circuitry 230 may also be configured to transfer address information (e.g., address bits) to the cache management circuitry 244. In some examples, the logic 262 may be a circuit configured to operate as a finite state machine (FSM).

The buffer circuitry 224 may be coupled with the data bus interface 208, the command circuitry 230, the memory interface circuitry 234, and the memory interface circuitry 234. The buffer circuitry 224 may include a set of one or more buffer circuits for at least some banks, if not each bank, of the volatile memory 204. The buffer circuitry 224 may also include components (e.g., a memory controller) for accessing the buffer circuits. In one example, the volatile memory 204 may include sixteen banks and the buffer circuitry 224 may include sixteen sets of buffer circuits. Each set of the buffer circuits may be configured to store data from or for (or both) a respective bank of the volatile memory 204. As an example, the buffer circuit set for bank 0 (BK0) may be configured to store data from or for (or both) the first bank of the volatile memory 204 and the buffer circuit for bank 15 (BK15) may be configured to store data from or for (or both) the sixteenth bank of the volatile memory 204.

Each set of buffer circuits in the buffer circuitry 224 may include a pair of buffers. The pair of buffers may include one buffer (e.g., an open page data (OPD) buffer) configured to store data targeted by an access command (e.g., a write command or read command) from the host device and another buffer (e.g., a victim page data (VPD) buffer) configured to store data for an eviction process that results from the access command. For example, the buffer circuit set for BK0 may include the buffer 218 and the buffer 220, which may be examples of buffer 135-a and 135-b, respectively. The buffer 218 may be configured to store BK0 data that is targeted by an access command from the host device. And the buffer 220 may be configured to store data that is transferred from BK0 as part of an eviction process triggered by the access command. Each buffer in a buffer circuit set may be configured with a size (e.g., storage capacity) that corresponds to a page size of the volatile memory 204. For example, if the page size of the volatile memory 204 is 2 kB, the size of each buffer may be 2 kB. Thus, the size of the buffer may be equivalent to the page size of the volatile memory 204 in some examples.

The cache management circuitry 244 may be coupled with the command circuitry 230, the engines 246, and the schedulers 248, among other components. The cache management circuitry 244 may include a cache management circuit set for one or more banks (e.g., each bank) of volatile memory. As an example, the cache management circuitry 244 may include sixteen cache management circuit sets for BK0 through BK15. Each cache management circuit set may include two memory arrays that may be configured to store metadata for the volatile memory 204. As an example, the cache management circuit set for BK0 may include a memory array 252 (e.g., a Cache DRAM (CDRAM) Tag Array (CDT-TA)) and a memory array 254 (e.g., a CDRAM Valid (CDT-V) array), which may be configured to store metadata for BK0. In some examples, the memory arrays for multiple banks (e.g., two banks) may be combined and referred to as a group or a chunk. The memory arrays may also be referred to as arrays, local arrays, or buffers, among other suitable terminology. In some cases, the memory arrays may be or include volatile memory cells, such as static RAM (SRAM) cells. However, the memory arrays are not limited to SRAM.

Metadata may include tag information, validity information, or dirty information (or any combination thereof) associated with the volatile memory 204, among other examples. Tag information (e.g., tag addresses) may indicate which data is stored at an address of the volatile memory 204. For example, the tag information for an address of the volatile memory 204 may indicate the non-volatile memory address associated with the data stored at that address of the volatile memory 204. As noted, validity information may indicate whether the data stored in the volatile memory 204 is actual data (e.g., data having an intended order or form) or placeholder data (e.g., data being random or dummy, not having an intended or important order). And dirty information may indicate whether the data stored in the volatile memory 204 is different than corresponding data stored in the non-volatile memory 206. For example, dirty information may indicate whether data stored in the volatile memory 204 has been updated relative to data stored in the non-volatile memory 206.

A memory array 252 may be an example of a local array and may include memory cells that store metadata (e.g., tag information, validity information, dirty information) for one or more associated banks of the volatile memory 204. The memory array 252 may also be referred to as a tag memory array or tag memory. The metadata in a memory array 252 may be stored on a per-row basis (e.g., there may be respective metadata for each row of the associated volatile memory bank(s)). The interface controller 202 may check for requested data in the volatile memory 204 by referencing the metadata in the memory array 252. For instance, the interface controller 202 may receive, from a host device, a read command for data that is associated with an address of the non-volatile memory 206. The interface controller 202 may use a subset of the address bits to reference the metadata in the memory array 252. For instance, using set-associative mapping, the interface controller 202 may use a first subset of address bits to determine which set of n addresses is associated with the data, and may use a second subset of address bits to determine whether any of the n addresses in the set stores the data.

In addition to storing tag information, the memory array 252 may also store validity information that indicates whether the data in the volatile memory 204 is actual data (also referred to as valid data) or random data (also referred to as invalid data). For example, the volatile memory 204 may initially store random data and continue to do so until the volatile memory cells are written with data from a host device or the non-volatile memory 206. To track which data is valid, the memory array 252 may be configured to set a bit for a set (e.g., row) of volatile memory cells if actual data is stored in that set of volatile memory cells. This bit may be referred to a validity bit or a validity flag. As with the tag information, the validity information stored in the memory array 252 may be stored on a per-row basis. Thus, each validity bit may indicate the validity of data stored in an associated row in some examples. In some examples, the memory array 252 may also store dirty information that indicates whether a set (e.g., row) of volatile memory cells stores any dirty data. Like the validity information, the dirty information stored in the memory array 252 may be stored on a per-row basis.

A memory array 254 may also be an example of a local array. The memory array 254 may also be referred to as a data memory array or data memory. A memory array 254 may be similar to the memory array 252 and may also include memory cells that store metadata for one or more banks of the volatile memory 204 that is associated with the memory array 252. For example, a memory array 254 may store validity information and dirty information for one or more banks of the volatile memory 204. However, the metadata stored in the memory array 254 may be stored on a sub-block basis as opposed to a per-row basis. For example, the validity information stored in the memory cells of the memory array 254 may indicate the validity of data for subsets of volatile memory cells in a row of the volatile memory 204.

Thus, in some examples, metadata in a memory array 252 may be stored on a per-row basis (e.g., for 2 kB of data) and metadata in a memory array 252 may be stored on a per-sub-block basis (e.g., for 64B of data). To illustrate, the validity information in a memory array 254 may indicate the validity of each subset (e.g., 32B or 64B) of data stored in row of the volatile memory 204. Similarly, the dirty information stored in the memory array 254 may indicate which subsets of volatile memory cells in the row of the volatile memory 204 store dirty data. Storing metadata (e.g., tag information, validity information, dirty information) on a per-row basis in a memory array 252 may allow the interface controller 202 to determine whether there is a hit or a miss for data in the volatile memory 204. Storing metadata (e.g., validity information, dirty information) on a sub-block basis in a memory array 254 may allow the interface controller 202 to determine which one or more subsets of data to return to the host device (e.g., during a read process) and which one or more subsets of data to preserve in the non-volatile memory 206 (e.g., during an eviction process).

Each cache management circuit set may also include a respective pair of registers coupled with the command circuitry 230, the engines 246, the memory interface circuitry 234, the memory interface circuitry 240, and the memory arrays for that cache management circuit set, among other components. For example, a cache management circuit set may include a first register (e.g., a register 256 which may be an open page tag (OPT) register) configured to receive metadata (e.g., one or more bits of tag information, validity information, or dirty information, other information, or any combination) from the memory array 252 or the scheduler 248-b or both. The cache management circuitry set may also include a second register (e.g., a register 258 which may be a victim page tag (VPT) register) configured to receive metadata (e.g., validity information or dirty information or both) from the memory array 254 and the scheduler 248-a or both. The information in the register 256 and the register 258 may be transferred to the command circuitry 230 and the engines 246 to enable decision-making by these components. For example, the command circuitry 230 may issue commands for reading the non-volatile memory 206 or the volatile memory 204 based on or in response to metadata in the register 256, or the register 258, or both.

The engine 246-a may be coupled with the register 256, the register 258, and the schedulers 248. The engine 246-a may be configured to receive metadata from various components and issue commands to the schedulers 248 based on or in response to the metadata. For example, if the interface controller 202 is in a first mode such as a write-through mode, the engine 246-a may issue commands to the scheduler 248-b and in response the scheduler 248-b to initiate or facilitate the transfer of data from the buffer 218 to both the volatile memory 204 and the non-volatile memory 206. Alternatively, if the interface controller 202 is in a second mode such as a write-back mode, the engine 246-a may issue commands to the scheduler 248-b and in response the scheduler 248-b may initiate or facilitate the transfer of data from the buffer 218 to the volatile memory 204. In the event of a write-back operation, the data stored in the volatile memory 204 may eventually be transferred to the non-volatile memory 206 during a subsequent (e.g., following) eviction process.

The engine 246-b may be coupled with the register 258 and the scheduler 248-a. The engine 246-b may be configured to receive metadata from the register 258 and issue commands to the scheduler 248-a based on or in response to the metadata. For instance, the engine 246-b may issue commands to the scheduler 248-a to initiate or facilitate transfer of dirty data from the buffer 220 to the non-volatile memory 206 (e.g., as part of an eviction process). If the buffer 220 holds a set of data transferred from the volatile memory 204 (e.g., victim data), the engine 246-b may indicate which one or more subsets (e.g., which 64B) of the set of data in the buffer 220 should be transferred to the non-volatile memory 206.

The scheduler 248-a may be coupled with various components of the interface controller 202 and may facilitate accessing the non-volatile memory 206 by issuing commands to the memory interface circuitry 234. The commands issued by the scheduler 248-a may be based on or in response to commands from the command circuitry 230, the engine 246-a, the engine 246-b, or a combination of these components. Similarly, the scheduler 248-b may be coupled with various components of the interface controller 202 and may facilitate accessing the volatile memory 204 by issuing commands to the memory interface circuitry 240. The commands issued by the scheduler 248-b may be based on or in response to commands from the command circuitry 230 or the engine 246-a, or both.

The memory interface circuitry 234 may communicate with the non-volatile memory 206 via one or more of the data bus interface 212 and the C/A bus interface 214. For example, the memory interface circuitry 234 may prompt the C/A bus interface 214 to relay commands issued by the memory interface circuitry 234 over the C/A bus 236 to a local controller in the non-volatile memory 206. And the memory interface circuitry 234 may transmit to, or receive data from, the non-volatile memory 206 over the data bus 232. In some examples, the commands issued by the memory interface circuitry 234 may be supported by the non-volatile memory 206 but not the volatile memory 204 (e.g., the commands issued by the memory interface circuitry 234 may be different than the commands issued by the memory interface circuitry 240).

The memory interface circuitry 240 may communicate with the volatile memory 204 via one or more of the data bus interface 216 and the C/A bus interface 264. For example, the memory interface circuitry 240 may prompt the C/A bus interface 264 to relay commands issued by the memory interface circuitry 240 over the C/A bus 242 to a local controller of the volatile memory 204. And the memory interface circuitry 240 may transmit to, or receive data from, the volatile memory 204 over one or more data buses 238. In some examples, the commands issued by the memory interface circuitry 240 may be supported by the volatile memory 204 but not the non-volatile memory 206 (e.g., the commands issued by the memory interface circuitry 240 may be different than the commands issued by the memory interface circuitry 234).

Together, the components of the interface controller 202 may operate the non-volatile memory 206 as a main memory and the volatile memory 204 as a cache. Such operation may be prompted by one or more access commands (e.g., read commands and write commands) received from a host device.

In some examples, the interface controller 202 may receive a write command from the host device. The write command may be received over the C/A bus 226 and transferred to the command circuitry 230 via one or more of the C/A bus interface 210 and the decoder 228. The write command may include or be accompanied by address bits that target a memory address of the non-volatile memory 206. The data to be written may be received over the data bus 260 and transferred to the buffer 218 via the data bus interface 208. In a write-through mode, the interface controller 202 may transfer the data to both the non-volatile memory 206 and the volatile memory 204. In a write-back mode, in some example, the interface controller 202 may transfer the data to only the volatile memory 204.

In either mode, the interface controller 202 may first check to see if the volatile memory 204 has space (e.g., available memory cells) to store the data. To do so, the command circuitry 230 may reference the metadata in the appropriate memory array 252 to determine whether one or more of the n addresses associated with the non-volatile memory address are empty (e.g., store random or invalid data) or whether one or more of the n addresses associated with the non-volatile memory address are full (e.g., store valid data). For example, the command circuitry 230 may determine whether one or more of the n addresses is available (or is unavailable) for writing based on tag information and validity information stored in the memory array 252. An address of the volatile memory 204 may be associated with a set of volatile memory cells which may be referred to as a line, cache line, cache block, or row.

If one of then associated addresses is available for writing, the interface controller 202 may transfer the data from the buffer 218 to the volatile memory 204 for storage at that address (e.g., in the set of associated volatile memory cells). But if none of the n associated addresses are available, the interface controller 202 may initiate an eviction process to make room for the data in the volatile memory 204. The eviction process may involve transferring the victim data from one of the n associated addresses to the buffer 220. The dirty information for the victim data may be transferred from the memory array 254 to the register 258 for identification of dirty subsets of the victim data. After the victim data is stored in the buffer 220, the new data can be transferred from the buffer 218 to the volatile memory 204 and the victim data can be transferred from the buffer 220 to the non-volatile memory 206. In some cases, dirty subsets of the old data may be transferred to the non-volatile memory 206 and clean subsets (e.g., unmodified subsets) may be discarded. The dirty subsets may be identified by the engine 246-$b$ based on or in response to dirty information transferred from the memory array 254 to the register 258 during the eviction process.

In another example, the interface controller 202 may receive a command, such as a read command, from the host device. The read command may be received over the C/A bus 226 and transferred to the command circuitry 230 via one or more of the C/A bus interface 210 and the decoder 228. The read command may include address bits that target a memory address of the non-volatile memory 206. Before attempting to access the targeted memory address of the non-volatile memory 206, the interface controller 202 may check to see if the volatile memory 204 stores the data. To do so, the command circuitry 230 may reference the metadata in the memory array 252 (e.g., using a set of the non-volatile memory address bits) to determine whether one or more of the n addresses associated with the non-volatile memory address stores the requested data. If the requested data is stored in the volatile memory 204, the interface controller 202 may transfer the requested data to the buffer 218 for transmission to the host device over the data bus 260.

If the requested data is not stored in the volatile memory 204 (e.g., the requested data may be stored in the non-volatile memory 206 or another location), the interface controller 202 may retrieve the data from the non-volatile memory 206 and transfer the data to the buffer 218 for transmission to the host device over the data bus 260. Additionally, the interface controller 202 may transfer the requested data from the buffer 218 to the volatile memory 204 so that the data can be accessed with a lower latency during a subsequent retrieval operation. Before transferring the requested data, however, the interface controller 202 may first determine whether one or more of the n associated addresses is available to store the requested data (e.g., whether one or more of the n associated addresses is empty or is full). The interface controller 202 may determine the availability of the n associated addresses by communicating with the related cache management circuit set. If an associated address is available, the interface controller 202 may transfer the data in the buffer 218 to the volatile memory 204 without performing an eviction process. Otherwise, the interface controller 202 may transfer the data from the buffer 218 to the volatile memory 204 after performing an eviction process.

The memory subsystem 200 may be implemented in one or more configurations, including one-chip versions and multi-chip versions. A multi-chip version may include one or more constituents of the memory subsystem 200, including the interface controller 202, the volatile memory 204, and the non-volatile memory 206 (among other constituents or combinations of constituents), on a chip that is separate from a chip that includes one or more other constituents of the memory subsystem 200. For example, in one multi-chip version, respective separate chips may include each of the interface controller 202, the volatile memory 204, and the non-volatile memory 206. In contrast, a one-chip version may include the interface controller 202, the volatile memory 204, and the non-volatile memory 206 on a single chip.

As noted, the queue 250 may store commands received from the host device and the command circuitry 230 may issue those commands to other components of the interface controller 202 (e.g., to the schedulers 248) as determined by the logic 262. Thus, the queue 250 may store relatively many commands (e.g., because the queue 250 stores commands for both the volatile memory 204 and the non-volatile memory 206). According to the techniques described herein, the interface controller 202 may perform hazard detection by comparing a received command to the commands in a bank-specific buffer rather than comparing the received command to all the commands in the queue 250. The bank-specific buffers may be smaller than (e.g., contain fewer entries than) the queue. Thus, relative to other techniques, the interface controller 202 may use a reduced quantity of comparators for hazard detection, which may improve performance of the interface controller 202.

Figure 3:
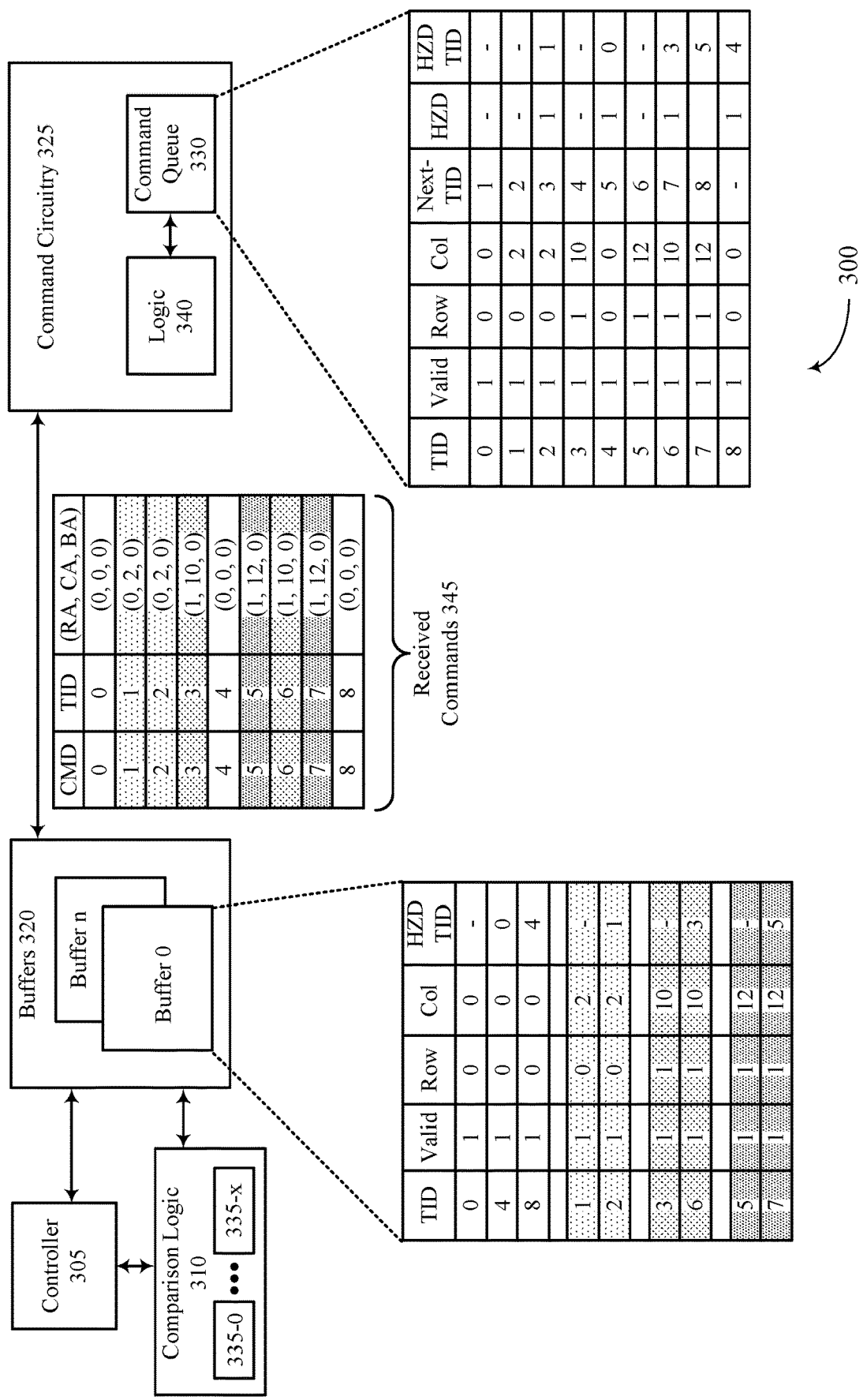
FIG. 3 illustrates an example of an interface controller that supports hazard detection in a multi-memory device in accordance with examples as disclosed herein.

FIG. 3 illustrates an example of an interface controller 300 that supports hazard detection in a multi-memory device in accordance with examples as disclosed herein. The interface controller 300 may be an example of an interface controller 115 or an interface controller 202 as described with reference to FIGS. 1 and 2, respectively. Among other potential components, the interface controller 300 may include a controller 305, comparison logic 310, buffers 320, and command circuitry 325, which may be coupled with one another via one or more transmission lines, buses, or both. As described herein, the interface controller 300 may perform hazard detection by comparing received commands with commands in one or more other components, such as the buffers 320 (rather than the commands in the command queue 330), which may provide for various advantages as described herein.

The buffers 320 (e.g., buffer 0 through buffer n) may be configured to store received commands (e.g., commands from a host device) on a bank-specific basis and to communicate command information to the command circuitry 325 (e.g., for entry into the command queue 330). For example, each buffer 320 may be configured to store received commands for a corresponding bank of a volatile memory coupled with the interface controller 300. To illustrate, buffer 0 may be configured to store received commands for bank 0 (and not for other banks), buffer 1 may be configured to store received commands for bank 1 (and not for other banks), and so on and so forth. Thus, the interface controller 300 may include a buffer 320 per bank of the volatile memory. Put another way, the quantity of buffers 320 may be equal to the quantity of banks in the volatile memory. However, other configurations and quantities of the buffers 320 are contemplated and within the scope of the present disclosure. Storing a command may refer to storing information (e.g., address information, identifying information command type) for that command.

In some examples, some or all of the buffers 320 may be collapsing buffers. A collapsing buffer may be a buffer that is configured to add entries to the last available position and remove entries in any order (e.g., regardless of factors such as age (i.e., the amount of time spend in the buffer) and addition order). Thus, a collapsing buffer may differ from a first-in-first out (FIFO) buffer or other type of buffer that is configured to add and removed entries in a particular order. If an entry is removed, a collapsing buffer may be configured to shift down the entries above the removed entry, thereby collapsing the size of the buffer. In some examples, the buffers 320 may have a maximum capacity (e.g., quantity of entries) that cannot be exceeded, which may prevent the interface controller 300 from storing more commands in the buffers 320 than the comparison logic 310 can handle.

The comparison logic 310 may be configured to compare address information for commands. For example, the comparison logic 310 may be configured to compare address information for received commands with address information for commands in the buffers 320. Comparing commands may refer to comparing information (e.g., address information) for the commands. Thus, the comparison logic 310 may be configured to compare bank addresses, row addresses, column addresses, or a combination of these addresses. The comparison logic 310 may include comparators 335-0 through 335-$x$. In some examples, the quantity of comparators 335 may be equal to the quantity of buffers 320 multiplied by the maximum quantity of entries per buffer. However, other quantities of buffers are contemplated and within the scope of the present disclosure.

The controller 305 may be configured to control the buffers 320 and the comparison logic 310 by communicating control signals to the buffers 320 and the comparison logic 310, respectively. In some examples, the controller 305 may receive information (e.g., from the buffers 320, the comparison logic 310, or other components of the interface controller 300) that the controller 305 uses as a basis for controlling the buffers 320 and the comparison logic 310.

The command circuitry 325 may be an example of the command circuitry 230 described with reference to FIG. 2. The command circuitry 325 may include the command queue 330, which may store commands for the volatile memory and a non-volatile memory (among other commands) and logic 340, which may manage the commands. For example, the logic 340 may determine the ordering and timing for issuing commands in the command queue 330 to other components of the interface controller 300. In general, commands may be added to the command queue 330 in response to receipt of the commands and may be removed from the command queue 330 upon issuance to one or more other components of the interface controller 300.

The command queue 330 may include various fields for different types of information (represented by corresponding entries) associated with the commands. For example, the command queue 330 may include transaction identifier (TID) fields for identification information (e.g., TIDs). Additionally or alternatively, the command queue 330 may include valid fields for validity information that indicates whether an associated TID is valid. Additionally or alternatively, command queue 330 may include row fields for row information (e.g., row addresses). Additionally or alternatively, the command queue 330 may include column fields for column information (e.g., column addresses). Additionally or alternatively, the command queue 330 may include bank fields (not shown) for bank information (e.g., bank addresses). Additionally or alternatively, the command queue 330 may include Next-TID fields for ordering information that indicates the order in which commands were received. Additionally or alternatively, command queue 330 may include hazard (HZD) fields for hazard information that indicates whether an associated command is a hazardous command. Additionally or alternatively, the command queue 330 may include a hazard TID field for hazard TID information that indicates the hazardous command associated with a command.

Additionally or alternatively, the command queue 330 may include row-hit fields (not shown) for row hit information that indicates whether there has been a row hit. Additionally or alternatively, the command queue 330 may include type fields (not shown) for information that indicates the type of a command. Additionally or alternatively, the command queue 330 may include schedule-to fields for information that indicates the intended memory (e.g., the volatile memory, the non-volatile memory) for the command. Additionally or alternatively, the command queue 330 may include want-issue fields for information that indicates whether commands are ready for issuance. Additionally or alternatively, the command queue 330 may include prefetch fields that are for information that indicates whether a prefetch operations is associated with the commands. Additionally or alternatively, the command queue 330 may include read identifier (RID) fields for RIDs that differentiate read commands from each other.

The operations of the interface controller 300 are first described at a high level, then described with reference to the received commands 345. At a high level, the interface controller 300 may receive a command (e.g., from a host device). The command may indicate address information (e.g., a bank address, a row address, and a column address). The interface controller 300 may add the command to the command queue 330 and determine the bank address for the command. Based on the bank address, the interface controller 300 may select a buffer 320 for a hazard detection procedure. For example, the interface controller 300 may select the buffer 320 that is configured for the bank indicated by the bank address for the command. To illustrate, if the bank address for the command is for bank n, the interface controller 300 may select buffer n (which corresponds to bank n) for the hazard detection procedure. After selecting the appropriate buffer for the hazard detection procedure, the interface controller 300 may compare (e.g., using the comparison logic 310) the address information for the command with the address information for commands in the selected buffer (e.g., buffer n). For example, the interface controller 300 may compare the row address for the command with the row addresses for the commands in buffer n and may compare the column address for the command with the column addresses for the commands in buffer n. The use of other address information (e.g., only row addresses, only column addresses, or other combinations of addresses) for hazard detection is contemplated and within the scope of the present disclosure.

If the address information between two compared commands matches, the interface controller 300 may determine that the commands are hazardous commands that are subject to execution ordering conditions. Accordingly, the interface controller 300 may replace the hazardous stored command in buffer n with the hazardous received command. Replacing a command may refer to removing the information for the command and adding the information for another command. Replacing the hazardous stored command with the hazardous received command may prevent the buffer from overflowing and may allow the interface controller 300 to compare incoming commands with the latest hazardous command. The interface controller 300 may also update the command queue 330 with hazard information. For example, the interface controller 300 may update (in the command queue 330) the hazard field for the hazardous stored command to indicate that that the stored command is a hazardous command. Additionally, the interface controller 300 may update (in the command queue 330) the hazard TID field for the hazardous stored command to indicate the TID of the corresponding hazardous command (e.g., the hazardous received command).

If the address information between two compared commands does not match, the interface controller 300 may determine that the commands are not hazardous commands (e.g., the commands are free of execution ordering conditions and can be executed in any order). Accordingly, the interface controller 300 may add the received command to buffer n (provided that buffer n is not already at the maximum capacity). If buffer n is at the maximum capacity, the interface controller 300 may wait until a command is removed from buffer n before adding the received command (or a different command from the command queue 330) to the buffer.

Reference is now made to the received commands 345, which may be commands received from a host device. The received commands may be received in descending order starting with command 0 and ending with command 8. Each command may have an associated TID, row address (RA), column address (CA), and bank address (BA). For ease of illustration the addresses associated with the received commands 345 are limited to a few addresses (e.g., row addresses 0 and 1, column addresses 0, 2, 10, and 12, and bank address 0). However, different addresses and different quantities of addresses are contemplated and within the scope of the present disclosure. Although described with reference to a single bank (e.g., bank 0), the techniques described herein may implemented for any quantity of banks. To aid in illustration, hazardous commands are shown with the same shading.

After receiving command (CMD) 0, the interface controller 300 may determine the bank associated with command 0. The interface controller 300 may determine the bank associated with command 0 based on the bank address for command 0, which may indicate the bank (e.g., bank 0). The interface controller 300 may then, concurrently (e.g., at partially or wholly overlapping times) or in any order, 1) add command 0 to the command queue 330, which may involve updating the various fields for command 0, and 2) select a buffer 320 for a hazard detection procedure for command 0. For example, the interface controller 300 may select buffer 0 for the hazard detection procedure based on buffer 0 corresponding to bank 0 (e.g., the bank for command 0). Assuming that command 0 is the first command received for bank 0, there may be no commands in buffer 0. Accordingly, the interface controller 300 may add command 0 to buffer 0.

After receiving command 1, the interface controller 300 may determine the bank (e.g., bank 0) associated with command 1. The interface controller 300 may then, concurrently or in any order, 1) add command 1 to the command queue 330, and 2) select a buffer 320 for a hazard detection procedure for command 1. For example, the interface controller 300 may select buffer 0 for the hazard detection procedure based on buffer 0 corresponding to bank 0 (e.g., the bank for command 1). The interface controller 300 may then compare address information for command 1 with address information for the commands stored in buffer 0. For example, the interface controller 300 may compare the row address for command 1 with the row address for command 0 and may compare the column address for command 1 with the column address for command 0. Based on the comparison, the interface controller 300 may determine that the address information for command 1 does not match (e.g., is different than, is not equal to) the address information for command 0 (e.g., because the column address (CA=2) for command 1 is different than the column address (CA=0) for command 0). Accordingly, the interface controller 300 may add command 1 to buffer 0.

After receiving command 2, the interface controller 300 may determine the bank (e.g., bank 0) associated with command 2. The interface controller 300 may then, concurrently or in any order, 1) add command 2 to the command queue 330, and 2) select a buffer 320 for a hazard detection procedure for command 2. For example, the interface controller 300 may select buffer 0 for the hazard detection procedure based on buffer 0 corresponding to bank 0 (e.g., the bank for command 2). The interface controller 300 may then compare address information for command 2 with address information for the commands stored in buffer 0. For example, the interface controller 300 may compare the row address for command 2 with the row addresses for commands 0 and 1 and may compare the column address for command 2 with the column address for commands 0 and 1. Based on the comparison, the interface controller 300 may determine that the address information for command 2 matches (e.g., is the same as, is equal to) the address information for command 1. Accordingly, the interface controller 300 may, concurrently or in any order, 1) replace command 1 with command 2 in the buffer 0, and 2) update the command queue 330 with hazard information.

Replacing command 1 with command 2 may involve removing command 1 from buffer 0 and adding command 2 to buffer 0 (e.g., as a new entry and not necessarily in the same position as command 1). Additionally, the interface controller 300 may update the hazard TID field (in buffer 0) for command 2 to indicate that command 1 is the hazardous command associated with command 2. Updating the command queue 330 with hazard information may involve updating the hazard field for command 2 to indicate that command 2 is a hazardous command, updating the hazard TID field for command 2 to indicate that command 1 is the hazardous command associated with command 2, or both.

After receiving command 3, the interface controller 300 may determine the bank (e.g., bank 0) associated with command 3. The interface controller 300 may then, concurrently or in any order, 1) add command 3 to the command queue 330, and 2) select a buffer 320 for a hazard detection procedure for command 3. For example, the interface controller 300 may select buffer 0 for the hazard detection procedure based on buffer 0 corresponding to bank 0 (e.g., the bank for command 3). The interface controller 300 may then compare address information for command 3 with address information for the commands stored in buffer 0. For example, the interface controller 300 may compare the row address for command 3 with the row addresses for command 0 and command 2 (which replaced command 1) and may compare the column address for command 3 with the column addresses for command 0 and command 2. Based on the comparison, the interface controller 300 may determine that the address information for command 3 does not match (e.g., is different than, is not equal to) the address information for either command 0 or command 2. Accordingly, the interface controller 300 may add command 3 to buffer 0.

After receiving command 4, the interface controller 300 may determine the bank (e.g., bank 0) associated with command 4. The interface controller 300 may then, concurrently or in any order, add command 4 to the command queue 330, and 2) select a buffer 320 for a hazard detection procedure for command 4. For example, the interface controller 300 may select buffer 0 for the hazard detection procedure based on buffer 0 corresponding to bank 0 (e.g., the bank for command 4). The interface controller 300 may then compare address information for command 4 with address information for the commands stored in buffer 0. For example, the interface controller 300 may compare the row address for command 4 with the row addresses for command 0, command 2 (which replaced command 1), and command 3 and may compare the column address for command 4 with the column addresses for command 0, command 2, and command 3. Based on the comparison, the interface controller 300 may determine that the address information for command 4 matches the address information for command 0. Accordingly, the interface controller 300 may, concurrently or in any order, 1) replace command 0 with command 4 in buffer 0 (e.g., by removing command 0 and adding command 4), and 2) update the command queue 330 with hazard information.

Similar operations may be performed for commands 5 through 8 and, for brevity, are not repeated herein. Thus, the interface controller 300 may perform hazard detection by comparing received commands with commands in the buffers 320 (rather than commands in the command queue 330), which may provide for various advantages as described herein.

Figure 4:
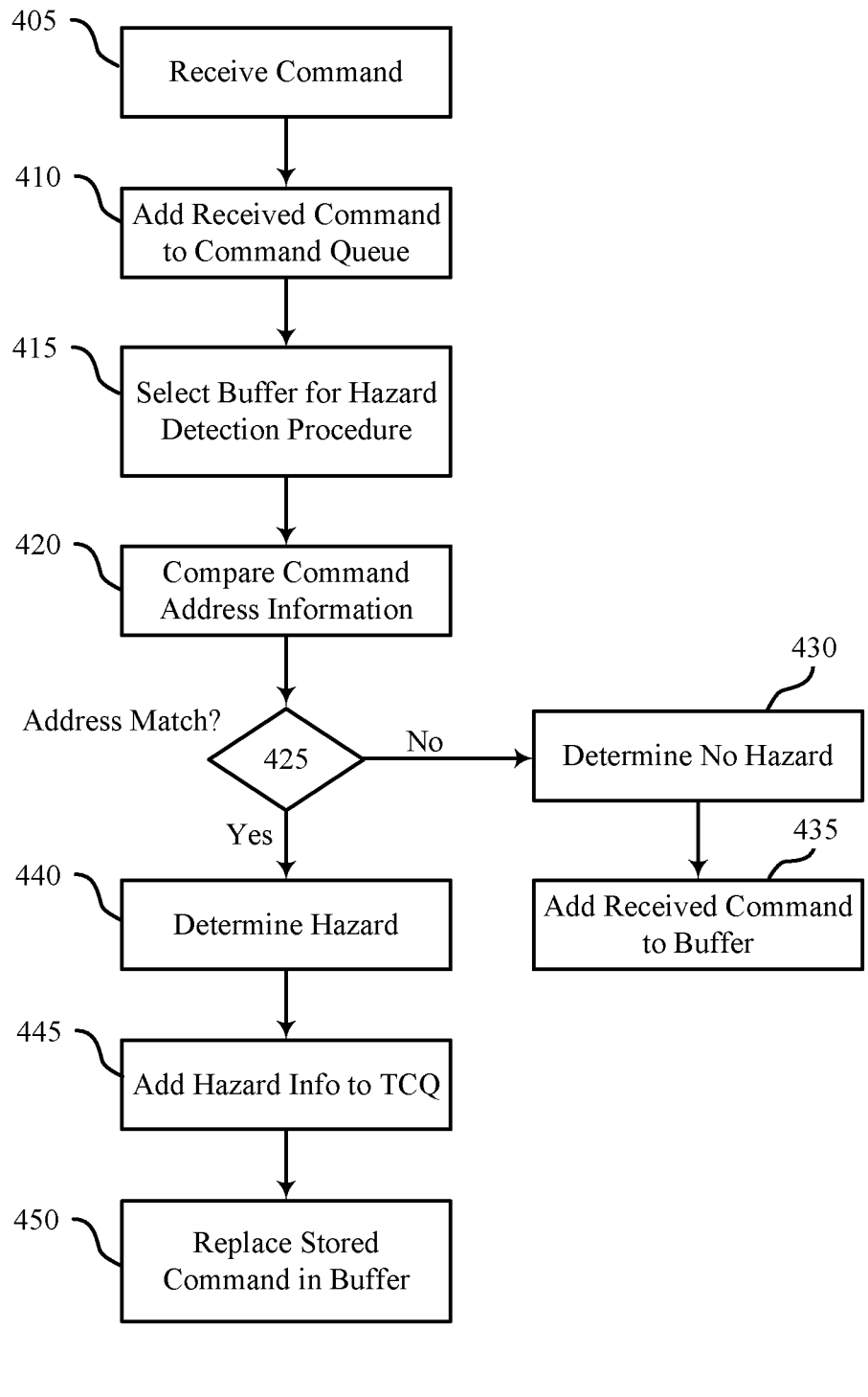
FIG. 4 illustrates an example of a process flow that supports hazard detection in a multi-memory device in accordance with examples as disclosed herein.

FIG. 4 illustrates an example of a process flow 400 that supports hazard detection in a multi-memory device in accordance with examples as disclosed herein. Process flow 400 may be implemented by a memory subsystem 110 or an interface controller 115 as described with reference to FIG. 1, a memory subsystem 200 or an interface controller 202 as described with reference to FIG. 2, or an interface controller 300 as described with reference to FIG. 3. However, other types of devices or components (or combinations thereof) may implement process flow 400. The process flow 400 may illustrate the operations of a device that uses buffers, such as bank-specific buffers, for hazard detection.

For ease of reference, the process flow 400 is described with reference to a device. For example, aspects of the process flow 400 may be implemented by a device that includes a volatile memory and a non-volatile memory. Additionally or alternatively, aspects of the process flow 400 may be implemented as instructions stored in memory (e.g., firmware stored in the volatile memory 120 or the non-volatile memory 125 or both). For example, the instructions, if executed by a controller, may cause the controller to perform the operations of the process flow 400.

At 405, a command may be received. For example, the interface controller 300 may receive a command from a host device. The received command may be associated with (e.g., indicate, include) address information such as a bank address, a row address, and a column address. In some examples, a row address may identify a row a memory cells that are coupled with a common word line. In some examples, a column address may identify a column of memory cells that are coupled with a common digit line.

At 410, the received command may be added to a command queue. For example, the interface controller 300 may add the received command to the command queue 330 based on or in response to receiving the command. At 415, a buffer for a hazard detection procedure for the received command may be selected. For example, from the buffers 320, the interface controller 300 may select a buffer that corresponds to the bank indicated by the bank address for the received command.

At 420, the address information for the received command may be compared to address information for commands stored in the selected buffer. For example, the interface controller 300 may (e.g., via the comparison logic 310) compare the address information for the received command with the address information for the commands stored in the selected buffer. In some examples, comparing address information may involve comparing the row address and column address for the received command with the respective row addresses and column addresses for the commands stored in the buffer.

At 425, it may be determined whether there is a match between address information. For example, the interface controller 300 may determine whether the address information for the received command matches the address information for any of the commands stored in the buffer. Address information may be said to match if the row address and column address for two commands is identical (e.g., equal, the same). If, at 425, it is determined that there is not a match between address information, the process flow 400 may proceed to 430. At 430, it may be determined that there is no hazard. For example, the interface controller 300 may determine that the received command is not a hazardous command with respect to any of the commands stored in the buffer. At 435, the received command may be added to the buffer based on the received command not being a hazardous command.

If, at 425, it is determined that there is a match between address information, the process flow 400 may proceed to 440. At 440, it may be determined that there is a hazard. For example, the interface controller 300 may determine that the received command is a hazardous command with respect to a stored command in the buffer. The interface controller 300 may also determine that the stored command is a hazardous command with respect to the received command. The interface controller 300 may determine that the command(s) are hazardous based on the commands having matching address information.

At 445, the command queue may be updated with hazard information. For example, the interface controller 300 may update the hazard field, the hazard TID field, or both, for the stored command in the command queue 330. At 450, the stored command in the buffer may be replaced by the received command. For example, the interface controller 300 may replace the stored command in the buffer with the received command.

Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
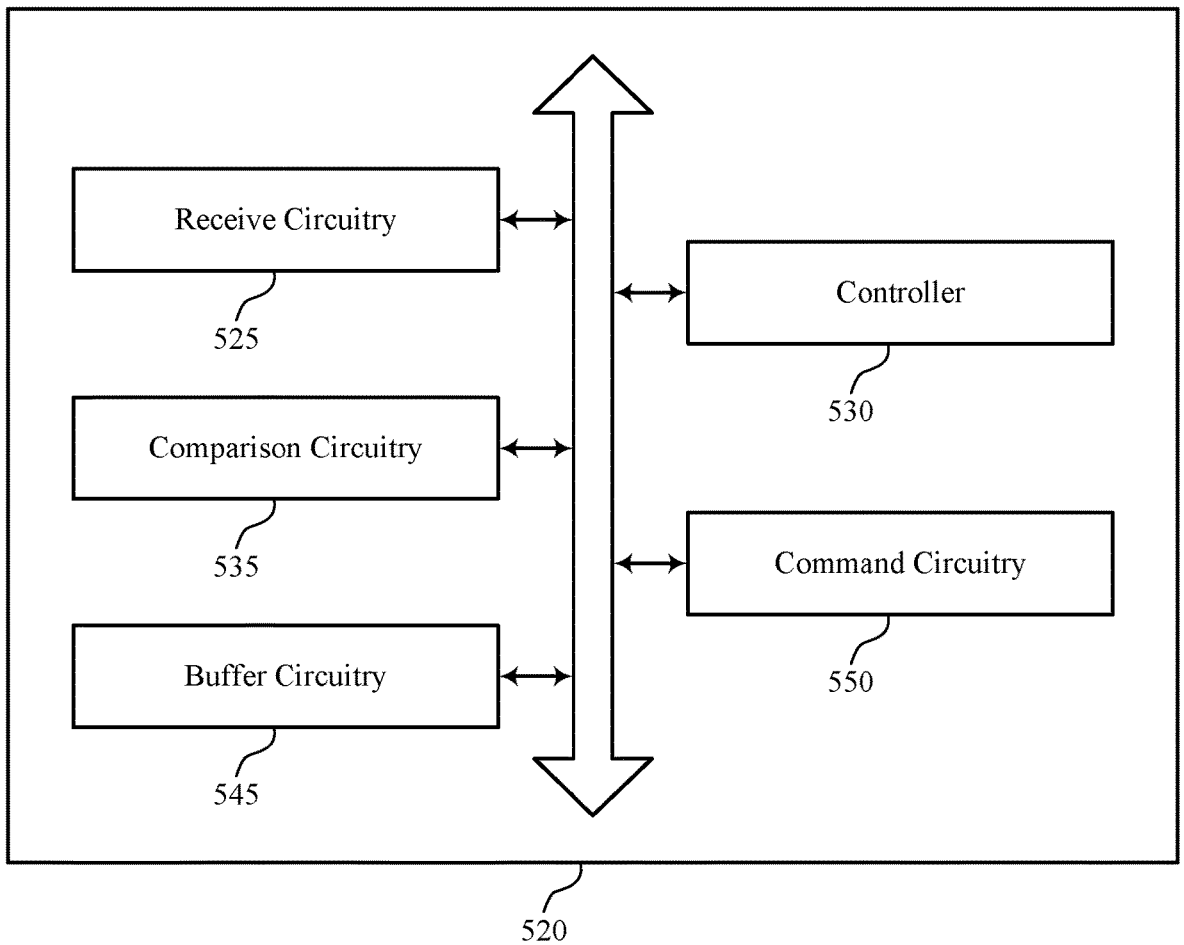
FIG. 5 shows a block diagram of a device that supports hazard detection in a multi-memory device in accordance with examples as disclosed herein.

FIG. 5 shows a block diagram 500 of a device 520 that supports hazard detection in a multi-memory device in accordance with examples as disclosed herein. The device 520 may be an example of aspects of a device as described with reference to FIGS. 1 through 4. The device 520, or various components thereof, may be an example of means for performing various aspects of hazard detection in a multi-memory device as described herein. For example, the device 520 may include a receive circuitry 525, a controller 530, a comparison circuitry 535, a buffer circuitry 545, a command circuitry 550, or any combination thereof. Each of these components may communicate, directly or indirectly, with one another (e.g., via one or more buses).

The receive circuitry 525 may be configured as or otherwise support a means for receiving a first command indicating a first bank address, a first row address, and a first column address. The controller 530 may be configured as or otherwise support a means for selecting, based at least in part on the first bank address and from a set of buffers each associated with a respective bank of a volatile memory, a buffer for a hazard detection procedure that detects hazardous commands that are subject to ordering conditions for execution. The comparison circuitry 535 may be configured as or otherwise support a means for comparing, as part of the hazard detection procedure and based at least in part on selecting the buffer, the first row address and the first column address from the first command with a second row address and a second column address from a second command in the buffer. In some examples, the controller 530 may be configured as or otherwise support a means for determining whether the first command and the second command are hazardous commands subject to an ordering condition for execution based at least in part on comparing the first row address and the first column address from the first command with the second row address and the second column address from the second command.

In some examples, hazardous commands include commands with matching bank addresses, row addresses, and column addresses. In some examples, the controller 530 may be configured as or otherwise support a means for determining that the first command and the second command are hazardous commands based at least in part on the first row address matching the second row address and based at least in part on the first column address matching the second column address.

In some examples, the buffer circuitry 545 may be configured as or otherwise support a means for replacing the second command in the buffer with the first command based at least in part on determining that the first command and the second command are hazardous commands.

In some examples, the command circuitry 550 may be configured as or otherwise support a means for adding the first command to a command queue based at least in part on receiving the first command, where the command queue stores commands for the volatile memory and commands for a non-volatile memory. In some examples, the command circuitry 550 may be configured as or otherwise support a means for updating the command queue based at least in part on determining that the first command is a hazardous command.

In some examples, to support updating the command queue, the command circuitry 550 may be configured as or otherwise support a means for adding a transaction identifier of the first command to a first field for the second command. In some examples, to support updating the command queue, the command circuitry 550 may be configured as or otherwise support a means for updating a second field for the second command to indicate that the second command is a hazardous command.

In some examples, the controller 530 may be configured as or otherwise support a means for determining that the first command and the second command are not hazardous commands based at least in part on the first row address being different than the second row address, based at least in part on the first column address being different than the second column address, or both. In some examples, the buffer circuitry 545 may be configured as or otherwise support a means for adding the first command to the buffer based at least in part on determining that the first command and the second command are not hazardous commands.

Figure 6:
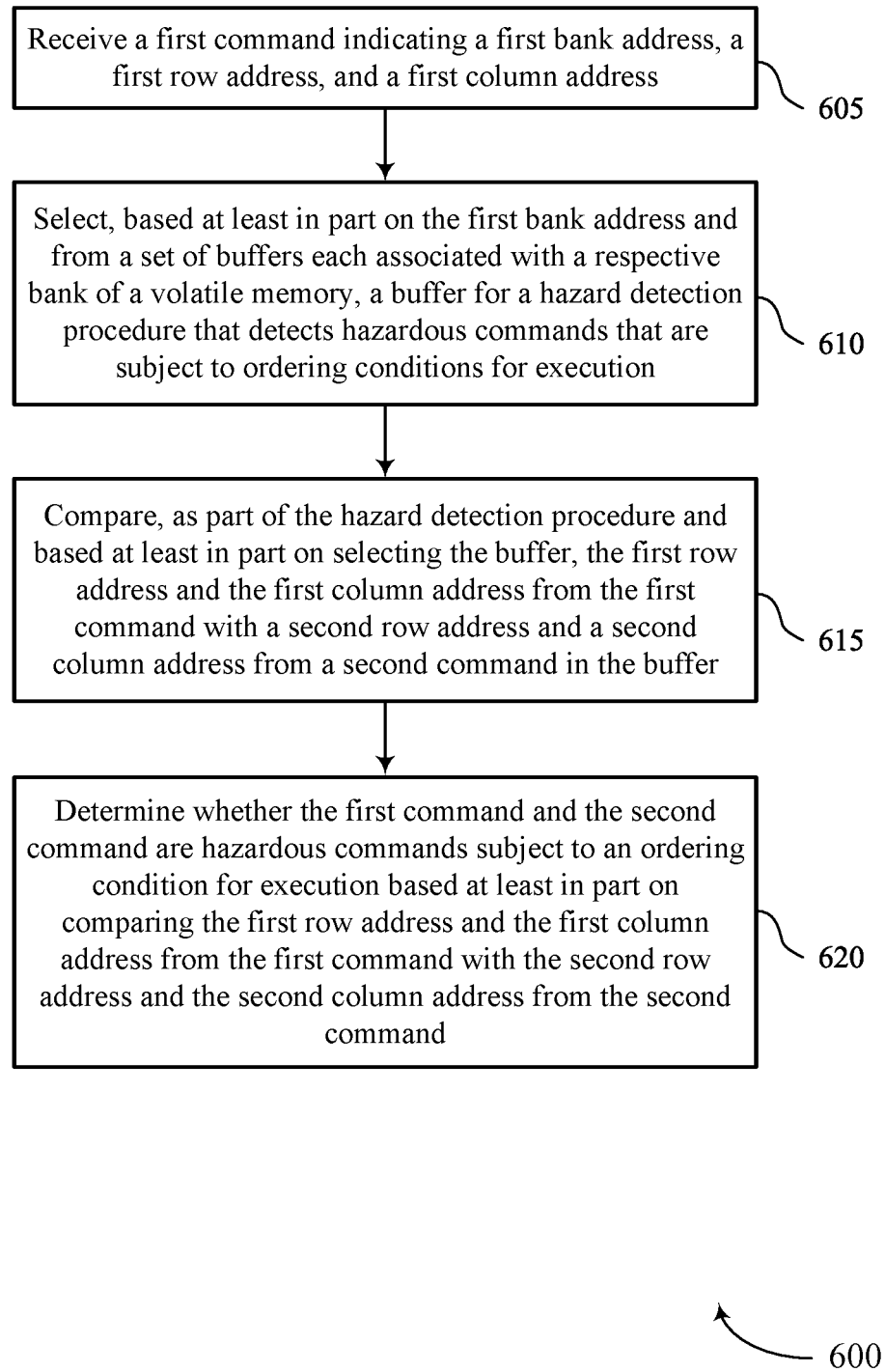
FIG. 6 shows a flowchart illustrating a method or methods that support hazard detection in a multi-memory device in accordance with examples as disclosed herein.

FIG. 6 shows a flowchart illustrating a method 600 that supports hazard detection in a multi-memory device in accordance with examples as disclosed herein. The operations of method 600 may be implemented by a device or its components as described herein. For example, the operations of method 600 may be performed by a device as described with reference to FIGS. 1 through 5. In some examples, a device may execute a set of instructions to control the functional elements of the device to perform the described functions. Additionally or alternatively, the device may perform aspects of the described functions using special-purpose hardware.

At 605, the method may include receiving a first command indicating a first bank address, a first row address, and a first column address. The operations of 605 may be performed in accordance with examples as disclosed herein. In some examples, aspects of the operations of 605 may be performed by a receive circuitry 525 as described with reference to FIG. 5.

At 610, the method may include selecting, based at least in part on the first bank address and from a set of buffers each associated with a respective bank of a volatile memory, a buffer for a hazard detection procedure that detects hazardous commands that are subject to ordering conditions for execution. The operations of 610 may be performed in accordance with examples as disclosed herein. In some examples, aspects of the operations of 610 may be performed by a controller 530 as described with reference to FIG. 5.

At 615, the method may include comparing, as part of the hazard detection procedure and based at least in part on selecting the buffer, the first row address and the first column address from the first command with a second row address and a second column address from a second command in the buffer. The operations of 615 may be performed in accordance with examples as disclosed herein. In some examples, aspects of the operations of 615 may be performed by a comparison circuitry 535 as described with reference to FIG. 5.

At 620, the method may include determining whether the first command and the second command are hazardous commands subject to an ordering condition for execution based at least in part on comparing the first row address and the first column address from the first command with the second row address and the second column address from the second command. The operations of 620 may be performed in accordance with examples as disclosed herein. In some examples, aspects of the operations of 620 may be performed by a controller 530 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving a first command indicating a first bank address, a first row address, and a first column address, selecting, based at least in part on the first bank address and from a set of buffers each associated with a respective bank of a volatile memory, a buffer for a hazard detection procedure that detects hazardous commands that are subject to ordering conditions for execution, comparing, as part of the hazard detection procedure and based at least in part on selecting the buffer, the first row address and the first column address from the first command with a second row address and a second column address from a second command in the buffer, and determining whether the first command and the second command are hazardous commands subject to an ordering condition for execution based at least in part on comparing the first row address and the first column address from the first command with the second row address and the second column address from the second command.

In some examples of the method 600 and the apparatus described herein, hazardous commands include commands with matching bank addresses, row addresses, and column addresses. Some examples of the method 600 and the apparatus described herein may further include operations, features, circuitry, logic, means, or instructions for determining that the first command and the second command may be hazardous commands based at least in part on the first row address matching the second row address and based at least in part on the first column address matching the second column address.

Some examples of the method 600 and the apparatus described herein may further include operations, features, circuitry, logic, means, or instructions for replacing the second command in the buffer with the first command based at least in part on determining that the first command and the second command may be hazardous commands.

Some examples of the method 600 and the apparatus described herein may further include operations, features, circuitry, logic, means, or instructions for adding the first command to a command queue based at least in part on receiving the first command, where the command queue stores commands for the volatile memory and commands for a non-volatile memory and updating the command queue based at least in part on determining that the first command may be a hazardous command.

In some examples of the method 600 and the apparatus described herein, updating the command queue may include operations, features, circuitry, logic, means, or instructions for adding a transaction identifier of the first command to a first field for the second command and updating a second field for the second command to indicate that the second command may be a hazardous command.

Some examples of the method 600 and the apparatus described herein may further include operations, features, circuitry, logic, means, or instructions for determining that the first command and the second command may be not hazardous commands based at least in part on the first row address being different than the second row address, based at least in part on the first column address being different than the second column address, or both.

Some examples of the method 600 and the apparatus described herein may further include operations, features, circuitry, logic, means, or instructions for adding the first command to the buffer based at least in part on determining that the first command and the second command may be not hazardous commands.

It should be noted that the methods described herein describe possible implementations, and that the operations and the steps may be rearranged or otherwise modified and that other implementations are possible. Further, portions from two or more of the methods may be combined.

An apparatus is described. The apparatus may include a non-volatile memory, a volatile memory, and an interface controller coupled with the non-volatile memory and the volatile memory, the interface controller operable to cause the apparatus to receive a first command indicating a first bank address, a first row address, and a first column address, select, based at least in part on the first bank address and from a set of buffers each associated with a respective bank of the volatile memory, a buffer for a hazard detection procedure that detects hazardous commands that are subject to ordering conditions for execution, compare, as part of the hazard detection procedure and based at least in part on selecting the buffer, the first row address and the first column address from the first command with a second row address and a second column address from a second command in the buffer, and determine whether the first command and the second command are hazardous commands subject to an ordering condition for execution based at least in part on comparing the first row address and the first column address from the first command with the second row address and the second column address from the second command.

In some examples of the apparatus, hazardous commands include commands with matching bank addresses, row addresses, and column addresses. In some examples, the apparatus may include determine that the first command and the second command may be hazardous commands based at least in part on the first row address matching the second row address and based at least in part on the first column address matching the second column address.

In some examples, the apparatus may include replace the second command in the buffer with the first command based at least in part on determining that the first command and the second command may be hazardous commands. In some examples, the apparatus may include a command queue, in the interface controller, that may be operable to store commands for the volatile memory and commands for the non-volatile memory, where the interface controller may be operable to cause the apparatus to add the first command to the command queue based at least in part on receiving the first command and update the command queue based at least in part on determining that the first command may be a hazardous command.

In some examples, the apparatus may include add a transaction identifier of the first command to a first field for the second command and update a second field for the second command to indicate that the second command may be a hazardous command. In some examples, the apparatus may include determine that the first command and the second command may be not hazardous commands based at least in part on the first row address being different than the second row address, based at least in part on the first column address being different than the second column address, or both.

In some examples, the apparatus may include add the first command to the buffer based at least in part on determining that the first command and the second command may be not hazardous commands. In some examples of the apparatus, the volatile memory includes a plurality of banks, and each buffer in the set of buffers may be configured to store commands for a respective bank of the plurality of banks.

In some examples of the apparatus, the buffer stores commands with bank addresses that match the first bank address and does not store commands with bank addresses that do not match the first bank address. In some examples of the apparatus, the buffer includes a collapsing buffer that may be configured to remove entries regardless of storage duration in the buffer, addition order to the collapsing buffer, or both.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

A protocol may define one or more communication procedures and one or more communication parameters supported for use by a device or component. For example, a protocol may define various operations, a timing and a frequency for those operations, a meaning of various commands or signals or both, one or more addressing scheme(s) for one or more memories, a type of communication for which pins are reserved, a size of data handled at various components such as interfaces, a data rate supported by various components such as interfaces, or a bandwidth supported by various components such as interfaces, among other parameters and metrics, or any combination thereof. Use of a shared protocol may enable interaction between devices because each device may operate in a manner expected, recognized, and understood by another device. For example, two devices that support the same protocol may interact according to the policies, procedures, and parameters defined by the protocol, whereas two devices that support different protocols may be incompatible.

To illustrate, two devices that support different protocols may be incompatible because the protocols define different addressing schemes (e.g., different quantities of address bits). As another illustration, two devices that support different protocols may be incompatible because the protocols define different transfer procedures for responding to a single command (e.g., the burst length or quantity of bytes permitted in response to the command may differ). Merely translating a command to an action should not be construed as use of two different protocols. Rather, two protocols may be considered different if corresponding procedures or parameters defined by the protocols vary. For example, a device may be said to support two different protocols if the device supports different addressing schemes, or different transfer procedures for responding to a command.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on or in response to the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, the term "substantially" means that the modified characteristic (e.g., a verb or adjective modified by the term substantially) need not be absolute but is close enough to achieve the advantages of the characteristic. As used herein, the term "concurrently" means that the described actions or phenomena occur during durations that at least partially overlap in time, that can occur at substantially the same time or be offset in time. As used herein, a "set" of objects may refer to one or more of the objects unless otherwise described or noted.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a non-volatile memory;
    a volatile memory; and
    an interface controller coupled with the non-volatile memory and the volatile memory, the interface controller operable to cause the apparatus to:
        receive a first command indicating a first bank address, a first row address, and a first column address;
        select, based at least in part on the first bank address and from a set of buffers each associated with a respective bank of the volatile memory, a buffer for a hazard detection procedure that detects hazardous commands that are subject to ordering conditions for execution;
        compare, as part of the hazard detection procedure and based at least in part on selecting the buffer, the first row address and the first column address from the first command with a second row address and a second column address from a second command in the buffer; and
        determine whether the first command and the second command are hazardous commands subject to an ordering condition for execution based at least in part on comparing the first row address and the first column address from the first command with the second row address and the second column address from the second command.

2. The apparatus of claim 1, wherein hazardous commands comprise commands with matching bank addresses, row addresses, and column addresses.

3. The apparatus of claim 1, wherein the interface controller is operable to:
    determine that the first command and the second command are hazardous commands based at least in part on the first row address matching the second row address and based at least in part on the first column address matching the second column address.

4. The apparatus of claim 3, wherein the interface controller is operable to:
    replace the second command in the buffer with the first command based at least in part on determining that the first command and the second command are hazardous commands.

5. The apparatus of claim 4, further comprising:
    a command queue, in the interface controller, that is operable to store commands for the volatile memory and commands for the non-volatile memory, wherein the interface controller is operable to cause the apparatus to:
        add the first command to the command queue based at least in part on receiving the first command; and
        update the command queue based at least in part on determining that the first command is a hazardous command.

6. The apparatus of claim 5, wherein the interface controller is operable to cause the apparatus to update the command queue by being operable to cause the apparatus to:
    add a transaction identifier of the first command to a first field for the second command; and
    update a second field for the second command to indicate that the second command is a hazardous command.

7. The apparatus of claim 1, wherein the interface controller is operable to:
    determine that the first command and the second command are not hazardous commands based at least in part on the first row address being different than the second row address, based at least in part on the first column address being different than the second column address, or both.

8. The apparatus of claim 7, wherein the interface controller is operable to:
    add the first command to the buffer based at least in part on determining that the first command and the second command are not hazardous commands.

9. The apparatus of claim 1, wherein the volatile memory comprises a plurality of banks, and wherein each buffer in the set of buffers is configured to store commands for a respective bank of the plurality of banks.

10. The apparatus of claim 1, wherein the buffer stores commands with bank addresses that match the first bank address and does not store commands with bank addresses that do not match the first bank address.

11. The apparatus of claim 1, wherein the buffer comprises a collapsing buffer that is configured to remove entries regardless of storage duration in the buffer, addition order to the collapsing buffer, or both.

12. A method, comprising:
    receiving a first command indicating a first bank address, a first row address, and a first column address;
    selecting, based at least in part on the first bank address and from a set of buffers each associated with a respective bank of a volatile memory, a buffer for a hazard detection procedure that detects hazardous commands that are subject to ordering conditions for execution;
    comparing, as part of the hazard detection procedure and based at least in part on selecting the buffer, the first row address and the first column address from the first command with a second row address and a second column address from a second command in the buffer; and
    determining whether the first command and the second command are hazardous commands subject to an ordering condition for execution based at least in part on comparing the first row address and the first column address from the first command with the second row address and the second column address from the second command.

13. The method of claim 12, wherein hazardous commands comprise commands with matching bank addresses, row addresses, and column addresses.

14. The method of claim 12, further comprising:
determining that the first command and the second command are hazardous commands based at least in part on the first row address matching the second row address and based at least in part on the first column address matching the second column address.

15. The method of claim 14, further comprising:
replacing the second command in the buffer with the first command based at least in part on determining that the first command and the second command are hazardous commands.

16. The method of claim 15, further comprising:
adding the first command to a command queue based at least in part on receiving the first command, wherein the command queue stores commands for the volatile memory and commands for a non-volatile memory; and
updating the command queue based at least in part on determining that the first command is a hazardous command.

17. The method of claim 16, wherein updating the command queue comprises:
adding a transaction identifier of the first command to a first field for the second command; and
updating a second field for the second command to indicate that the second command is a hazardous command.

18. The method of claim 12, further comprising:
determining that the first command and the second command are not hazardous commands based at least in part on the first row address being different than the second row address, based at least in part on the first column address being different than the second column address, or both.

19. The method of claim 18, further comprising:
adding the first command to the buffer based at least in part on determining that the first command and the second command are not hazardous commands.

20. A non-transitory computer-readable medium storing code comprising instructions which, when executed by a processor of an apparatus, cause the apparatus to:
receive a first command indicating a first bank address, a first row address, and a first column address;
select, based at least in part on the first bank address and from a set of buffers each associated with a respective bank of a volatile memory, a buffer for a hazard detection procedure that detects hazardous commands that are subject to ordering conditions for execution;
compare, as part of the hazard detection procedure and based at least in part on selecting the buffer, the first row address and the first column address from the first command with a second row address and a second column address from a second command in the buffer; and
determine whether the first command and the second command are hazardous commands subject to an ordering condition for execution based at least in part on comparing the first row address and the first column address from the first command with the second row address and the second column address from the second command.

21. The non-transitory computer-readable medium of claim 20, wherein the instructions, when executed by the processor of the apparatus, cause the apparatus to:
determine that the first command and the second command are hazardous commands based at least in part on the first row address matching the second row address and based at least in part on the first column address matching the second column address.

22. The non-transitory computer-readable medium of claim 21, wherein the instructions, when executed by the processor of the apparatus, cause the apparatus to:
replace the second command in the buffer with the first command based at least in part on determining that the first command and the second command are hazardous commands.

23. The non-transitory computer-readable medium of claim 22, wherein the instructions, when executed by the processor of the apparatus, cause the apparatus to:
add the first command to a command queue based at least in part on receiving the first command, wherein the command queue stores commands for the volatile memory and commands for a non-volatile memory; and
update the command queue based at least in part on determining that the first command is a hazardous command.

24. The non-transitory computer-readable medium of claim 23, wherein the instructions that cause the apparatus to update the command queue comprise instructions that cause the apparatus to:
add a transaction identifier of the first command to a first field for the second command; and
update a second field for the second command to indicate that the second command is a hazardous command.

25. The non-transitory computer-readable medium of claim 20, wherein the instructions, when executed by the processor of the apparatus, cause the apparatus to:
determine that the first command and the second command are not hazardous commands based at least in part on the first row address being different than the second row address, based at least in part on the first column address being different than the second column address, or both; and
add the first command to the buffer based at least in part on determining that the first command and the second command are not hazardous commands.

* * * * *